United States Patent [19]
Thiel

[11] Patent Number: 5,808,496
[45] Date of Patent: Sep. 15, 1998

[54] LOW CURRENT COMPARATOR WITH HYSTERESIS

[75] Inventor: Frank L. Thiel, Richardson, Tex.

[73] Assignee: Texas Instruments Incorporated, Dallas, Tex.

[21] Appl. No.: 63,968

[22] Filed: May 19, 1993

[51] Int. Cl.$^6$ ............................................... H03K 3/356
[52] U.S. Cl. ...................... 327/210; 327/214; 327/206; 327/67
[58] Field of Search .................. 307/290, 296.6, 307/354, 355, 362, 364, 579; 323/315, 316; 327/210, 214, 206, 67

[56] References Cited

U.S. PATENT DOCUMENTS

| | | | |
|---|---|---|---|
| 4,375,598 | 3/1983 | Sakai | 307/290 |
| 4,710,793 | 12/1987 | Gray | 307/495 |
| 5,049,761 | 9/1991 | Zitta | 307/494 |

*Primary Examiner*—Peter S. Wong
*Assistant Examiner*—Shawn Riley

*Attorney, Agent, or Firm*—Christopher L. Maginniss; W. James Brady, III; Richard L. Donaldson

[57] ABSTRACT

An accurate, low-current integrated circuit comparator includes a differential input stage 10 comprising differential pair transistors 22 and 24, differential pair current mirror transistors 26 and 28, and a constant current source transistor 30. The comparator also includes an hysteresis stage 12 coupled to one of the current mirror transistors; the hysteresis stage comprises an hysteresis mirror transistor 34 and a switching transistor 36. The comparator additionally includes a gain stage 14 comprising a gain transistor 38 and a constant current source transistor 40. Finally, the comparator includes an output stage 15 comprising gain transistor 42 in an open-drain configuration. In the disclosed embodiment, the descending trip threshold is set entirely by the ratios of device geometries, and is therefore very accurate and is independent of temperature, lithography and processing variations. While the ascending trip threshold is related to the ratio of tail current of the differential pair to the transistor gain of the devices in that pair, which quantities are dependent on the device parameters, this relationship is only to the one-half power, and therefore is relatively small.

16 Claims, 1 Drawing Sheet

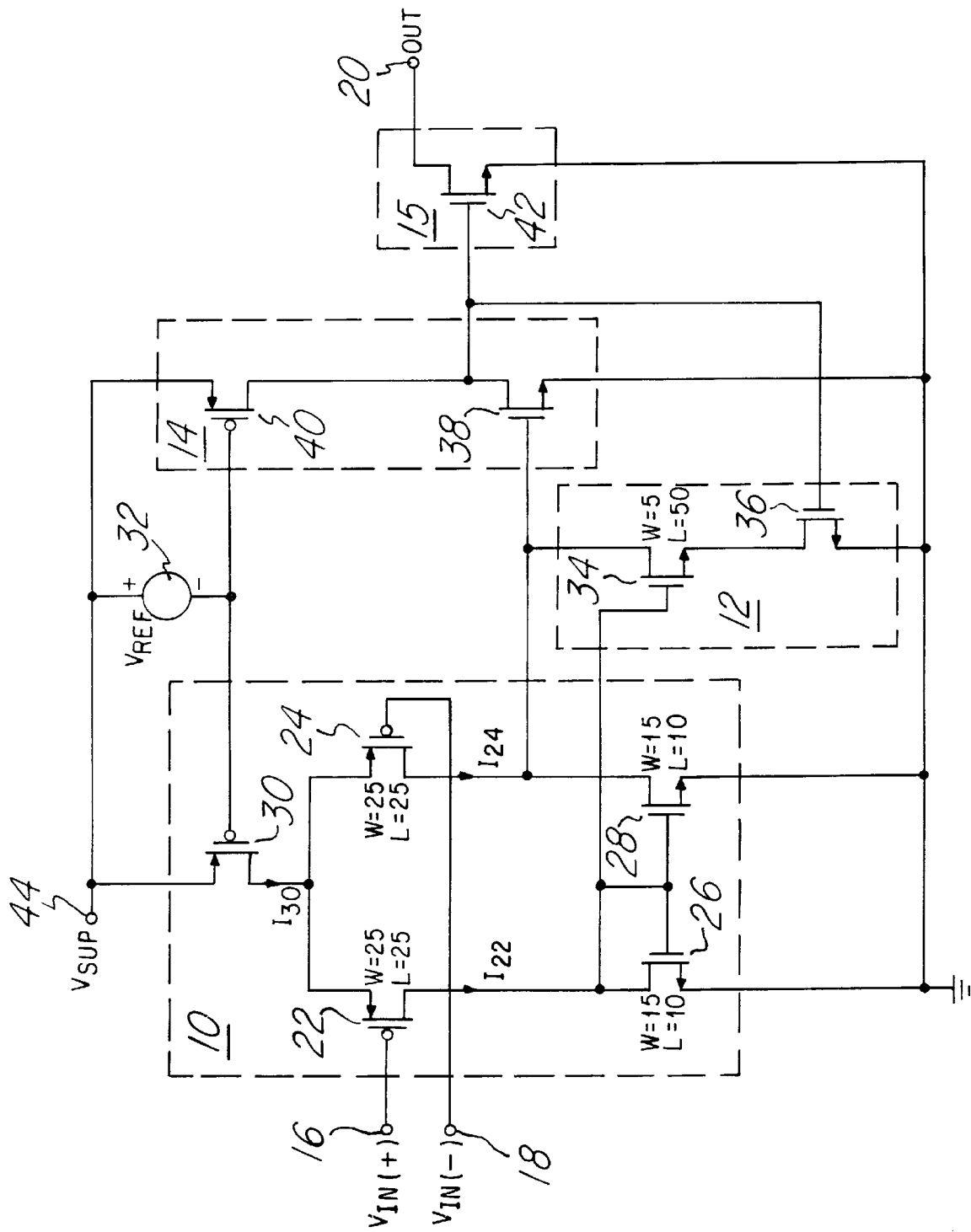

LOW CURRENT COMPARATOR WITH HYSTERESIS

BACKGROUND OF THE INVENTION

The present invention relates generally to electronic circuits and, more particularly, to an accurate, low-current integrated circuit comparator with hysteresis.

A typical comparator circuit compares the respective voltage levels of two input signals and generates its output condition in accordance with their relative values. In the usual case, the output switches between states when the two input voltages reach a point where they are substantially equal. This leads to uncertainty when the two inputs dwell at or near the trip point. Under this condition, the comparator output may switch back and forth in response to noise on the input lines.

In order to overcome this problem, some comparators include hysteresis circuits to provide individual trip thresholds for the positive-going and negative-going switching conditions, thereby avoiding the possibility of noise-induced switching when the voltage levels of the two input signals are very close to one another.

The traditional approaches by which hysteresis is included within comparators usually involve changes in the comparator input impedance, and require additional bias current to the hysteresis circuit. These approaches also have variability in the voltage levels of both the positive-going and negative-going trip points, thereby limiting the accuracy of such devices.

In view of the above, it is clear that there exists a need to develop an integrated circuit comparator which includes hysteresis, and which overcomes some of the deficiencies and limitations of comparators currently known in the art.

SUMMARY OF THE INVENTION

In accordance with the principles of the present invention, there is disclosed herein a combination comprising a first pair of transistors configured in a differential mode, and means for providing constant current into the conductance paths of the pair of differential transistors. The combination further comprises a second pair of transistors configured in a current mirror mode, the conductance paths of the current mirror transistors being individually coupled to the conductance paths of the differential mode transistors. Finally, the combination comprises an hysteresis stage providing a parallel conductance path to the conductance path of one of the current mirror transistors, the hysteresis stage responsive to a conductance state of one of the differential mode transistors for enabling current flow through the hysteresis stage.

Further in accordance with the present invention there is disclosed a comparator circuit for comparing the relative voltage levels of first and second input signals. The comparator circuit comprises first and second input nodes for receiving the first and second input signals, and a differential input stage including differential pair transistors, differential pair current mirror transistors, and a current source transistor for providing constant current into the conductance paths of the differential pair transistors. The differential pair transistors are coupled individually at their control electrodes to the first and second input nodes. Finally, the comparator circuit includes an hysteresis stage providing a parallel conductance path to the conductance path of one of the current mirror transistors, the hysteresis stage comprising an hysteresis mirror transistor in series with a switching transistor.

BRIEF DESCRIPTION OF THE DRAWING

The foregoing features of the present invention may be more fully understood in the following detailed description, read in conjunction with the accompanying drawing, wherein:

the sole FIGURE is a schematic diagram of a comparator in accordance with the present invention.

DESCRIPTION OF THE PREFERRED EMBODIMENT

Referring to the FIGURE, there is shown a schematic diagram of an accurate, low-current integrated circuit comparator in accordance with the principles of the present invention. The comparator includes a differential input stage 10 comprising differential pair transistors 22 and 24, differential pair current mirror transistors 26 and 28, and constant current source transistor 30. The comparator also includes an hysteresis stage 12 comprising hysteresis mirror transistor 34 and switching transistor 36. The comparator additionally includes a gain stage 14 comprising gain transistor 38 and constant current source transistor 40. Finally, the comparator includes an output stage 15 comprising gain transistor 42 in an open-drain configuration.

A first input node 16, denoted $V_{IN}(+)$, is coupled to the gate electrode of transistor 22, and a second input node 18, denoted $V_{IN}(-)$, is coupled to the gate electrode of transistor 24. A voltage supply node 44, denoted $V_{SUP}$, is coupled to the source electrodes of constant current source transistors 30 and 40, and to the positive terminal of a constant voltage source 32, denoted $V_{REF}$. The negative terminal of voltage source 32 is coupled to the gate electrodes of transistors 30 and 40, thereby maintaining a fixed negative voltage on the gates of those transistors with respect to their source electrodes. The open drain electrode of transistor 42 is coupled to an output node 20, denoted OUT.

Transistors 22 and 24 are configured in a differential mode, with the drain electrode of current source transistor 30 connected to their coupled source electrodes. Current mirror transistors 26 and 28 are cascoded with transistors 22 and 24, respectively, such that their conductance paths are series-connected; that is, the drain electrode of transistor 22 is coupled to the drain electrode of transistor 26, and the drain electrode of transistor 24 is coupled to the drain electrode of transistor 28. In accordance with the current mirroring arrangement, the drain electrode of transistor 26 is connected to its gate electrode and to the gate electrode of transistor 28, and the source electrodes of both transistors are connected to a reference potential which, in the present example, is ground. With this current mirroring arrangement, the gate-to-source voltages of both transistors 26 and 28 are equal. Since their width-to-length ratios are also equal, the currents through both of their conductance paths are equal and are determined by the current at the drain electrode of transistor 26.

Hysteresis stage 12 includes hysteresis mirror transistor 34 and switching transistor 36 having their conductance paths series-connected; that is, the source electrode of transistor 34 is coupled to the drain electrode of transistor 36. This series combination is coupled between the drain electrode of current mirror transistor 28 and the ground reference. The gate electrode of hysteresis mirror transistor 34 is connected to the gate electrodes of current mirror transistors 26 and 28, and the gate electrode of switching transistor 36 is coupled to the drain electrode of gain transistor 38. When the potential at the gate electrode of transistor 36 is sufficient to produce conduction along its conductance path, hysteresis stage 12 provides a parallel path to current mirror transistor 28, thereby sharing the current supplied to that transistor. When the potential at the gate electrode of transistor 36 causes cutoff of that device, hysteresis stage 12 draws no current from current mirror transistor 28. Thus, it is seen that by the action of switching transistor 36, hysteresis stage 12 is selectively switched in and out as a paralleling current path to current mirror transistor 28.

In gain stage 14, the gate electrode of gain transistor 38 is coupled to the drain electrode of differential transistor 24. The conductance path of transistor 38 is series-connected with the conductance path of constant current transistor 40 between the supply voltage $V_{SUP}$ and the ground reference. The interconnected drain electrodes of these transistors are additionally connected to the gate electrode of switching transistor 36 and to the gate electrode of output gain transistor 42. In this example, output gain transistor 42 has an open drain output which may be pulled up through an external resistor (not shown) to provide the output of the comparator.

In the embodiment illustrated herein, an integrated circuit including the above-mentioned transistors is fabricated using Complementary Metal-Oxide Semiconductor (CMOS) devices, wherein differential pair transistors 22 and 24 and constant current source transistors 30 and 40 comprise p-channel MOS (PMOS) field effect transistors (FET's), and wherein differential pair current mirror transistors 26 and 28, hysteresis mirror transistor 34, switching transistor 36, and gain transistors 38 and 42 comprise n-channel MOS (NMOS) FET's. The use of these low-current CMOS devices enables the comparator of the present invention to consume only a few microamperes of quiescent current, typically about six microamperes.

In accordance with the principles of the present invention, differential transistors 22 and 24 are substantially identical, and the ratios of the width-to-length (W/L) of their channels are (25/25), in an illustrative embodiment. Also in accordance with the principles of the present invention, current mirror transistors 26 and 28 are substantially identical, and the ratios of the width-to-length of their channels are (15/10), in the illustrative embodiment. The (W/L) dimension of the channel of hysteresis mirror transistor 34 in this embodiment is (5/50).

It will now be demonstrated that, using the structure recited above, a comparator circuit with hysteresis may be implemented, wherein the descending trip threshold is set entirely by the device geometry, and is therefore very accurate and independent of temperature and processing variations, and wherein the ascending trip threshold is only moderately dependent on the device parameters. The discussion which follows describes how the trip points of the comparator of the present invention are set, and identifies the degree of dependence of these settings on the parameters of the device.

Assuming initially that the voltage $V_{IN}(+)$ at input node 16 is substantially greater than the voltage $V_{IN}(-)$ at input node 18, then gain transistor 38 is held in its on state, maintaining switching transistor 36 in its off state. This effectively removes the effect of hysteresis stage 12 from the comparator, causing a mirror ratio trip point to be matched. Since the width-to-length ratios of transistors 22 and 24 are equal, and the width-to-length ratios of transistors 26 and 28 are equal, that is, $(W/L)_{22} = (W/L)_{24}$ and $(W/L)_{26} = (W/L)_{28}$, the comparator will trip when the voltage at input node 16 has descended to the voltage at input node 18. That is, in the comparator of the illustrated embodiment, the descending trip threshold, called V(−), occurs when the voltage at input node 16 descends to the voltage at input node 18, and $V_{IN}(+) = V_{IN}(-)$. This is caused by the increasing current through transistor 28 exactly offsetting the decreasing current from transistor 24, and therefore switching gain transistor 38 off at the defined threshold. It will be noted that trip point V(−) is dependent solely on ratios of device geometries and is therefore independent of device parameters that shift with process, lithography and temperature variations. This causes the trip point to be extremely accurate and reliably reproducible.

When gain transistor 38 turns off, switching transistor 36 turns on, and the conductance path of hysteresis mirror transistor 34 is effectively added in parallel with the conductance path of current mirror transistor 28, thereby changing the mirror ratio. The equations which follow describe this:

$$\Delta V_H \equiv V(+) - V(-) = \text{Hysteresis amount} \qquad (1)$$

where V(+) is the ascending trip threshold.

$$\Delta V_H = V_{gs22} - V_{gs24} \qquad (2)$$

$$V_{gs22} = -\sqrt{I_{22}/[K'_p \cdot (W/L)_{22}]} + V_{tp} \qquad (3a)$$

$$V_{gs24} = -\sqrt{I_{24}/[K'_p \cdot (W/L)_{24}]} + V_{tp} \qquad (3b)$$

where $K'_p$ is the transistor gain of matched PMOS devices 22 and 24.

According to the new mirror ratio, the trip point V(+) is defined as the input condition for which $$I_{24} = I_{22} \cdot \{[(W/L)_{28} + (W/L)_{34}]/(W/L)_{26}\} \qquad (4)$$

Assuming ideal MOS devices and assuming transistor 36 to be a perfect switch, then defining the (W/L) ratio of transistors 22 and 24, which are matched PMOS devices, as $a_p \equiv (W/L)_P = (W/L)_{22} = (W/L)_{24}$, and defining the (W/L) ratio of transistors 26 and 28, which are matched NMOS devices, as $a_N \equiv (W/L)_N = (W/L)_{26} = (W/L)_{28}$, and further defining the (W/L) ratio of transistor 34, the hysteresis device, as $a_H \equiv (W/L)_H = (W/L)_{34}$, then $$\Delta V_H = (K'_p \cdot a_p)^{-\frac{1}{2}} \cdot (\sqrt{I_{24}} - \sqrt{I_{22}}) \qquad (5)$$

Combining Equations (4) and (5), $$\Delta V_H = \qquad (6)$$

$$\sqrt{I_{22}/(K'_p \cdot a_p)} \cdot (\sqrt{\{[(W/L)_{28} + (W/L)_{34}]/(W/L)_{26}\}} - 1), \text{ and}$$

$$\Delta V_H = \sqrt{I_{22}/(K'_p \cdot a_p)} \cdot \{\sqrt{[(a_N + a_H)/a_N]} - 1\}.$$

Recognizing from the circuit diagram that $I_{22} + I_{24} = I_{30}$, and applying the defining equations for the (W/L) ratios to Equation (1), it is seen that $$I_{22}=I_{30}-I_{22}\cdot(a_N+a_H)/a_N, \text{ and}$$

$$I_{22}=I_{30}\cdot a_N/(2a_N+a_H). \tag{7}$$

Further defining the bias current, or tail current, through constant current source transistor 30 as $$I_0=I_{30},$$

Combining Equations (6) and (7) then yields $$\Delta V_H = \sqrt{I_0/(K'_p \cdot a_P)} \cdot [(\sqrt{a_N+a_H} - \sqrt{a_N})/\sqrt{2a_N+a_H}]. \tag{8}$$

The foregoing Equation (8) demonstrates that the amount of hysteresis in the disclosed comparator is determined by controlling the relationship of the device size ratios of the hysteresis transistor and the current mirror transistors, and by the ratio of the tail current to the device size ratio of the differential pair transistors.

In the disclosed example, the descending trip point, $V_{IN}(-)$, is the threshold which is set by the device geometry, and is therefore very accurate and is independent of temperature and processing variations. Furthermore, while the ascending trip point, $V_{IN}(+)$, is related to the ratio of the tail current, $I_0$, to $K'_p$, which are dependent on the device parameters, this relationship is only to the one-half power, and therefore is relatively small.

It will be recognized by one of skill in the art that certain structural modifications in the illustrative comparator may be made so as to establish the ascending trip point as the one which is determined entirely by the ratios of device geometries, and is therefore very accurate and independent of temperature and processing variations. In particular, such modifications might entail connecting the drain of hysteresis mirror transistor 34 to the drain of current mirror transistor 26, rather than current mirror transistor 28, and connecting the gate of switching transistor 36 to the drain of differential transistor 24, rather than gain transistor 38. This would effectively move the hysteresis circuit to the opposite leg of the differential pair 22,24, making the positive threshold the accurate one. In this case, one of skill in the art would be able to modify the above equations such as to recognize that the ascending trip point is determined entirely by the device geometry, and that the descending trip point is related by the one-half power to the ratio of the tail current to the transistor gain.

The comparator of the present invention, as illustrated in the FIGURE and as described above, overcomes certain limitations of prior art approaches associated with adding hysteresis to a differential stage. It is small; it requires only two transistors. No additional power supply current is consumed by the hysteresis stage. The hysteresis does not change the input characteristics of the circuit; no current or voltage shift is visible at the inputs. The circuit allows a wide range of hysteresis to be set. Finally, either the positive or negative trip point can be very accurately set independently of device parameters. Hence, for the requirements envisioned for an accurate, low-current integrated circuit comparator with hysteresis, the approach in accordance with the present invention provides a significant advantage.

While the principles of the present invention have been demonstrated with particular regard to the structure disclosed herein, it will be recognized that various departures may be undertaken in the practice of the invention. The scope of the invention is not intended to be limited to the particular structure disclosed herein, but should instead be gauged by the breadth of the claims which follow.

What is claimed is:

1. In combination:
    a first pair of transistors configured in a differential mode;
    means for providing constant current into the conductance paths of said pair of differential transistors;
    a second pair of transistors configured in a current mirror mode, the conductance paths of said current mirror transistors individually coupled to the conductance paths of said differential mode transistors;
    an hysteresis stage having a conductance path coupled in parallel to the conductance path of one of said current mirror transistors, said hysteresis stage responsive to a conductance state of one of said differential mode transistors for enabling current through said hysteresis stage.

2. The combination in accordance with claim 1 wherein said pair of differential transistors are substantially identical, and wherein said pair of current mirror transistors are substantially identical.

3. The combination in accordance with claim 1 wherein said hysteresis stage comprises an hysteresis transistor and a switching transistor, said hysteresis transistor and said switching transistor having their conductance paths series-connected.

4. The combination in accordance with claim 3 wherein said hysteresis transistor has its control electrode coupled to the control electrodes of said two current mirror transistors.

5. The combination in accordance with claim 3 further comprising a gain transistor coupled to a conductance electrode of said one differential mode transistor.

6. The combination in accordance with claim 5 wherein said switching transistor has its control electrode coupled to a conductance electrode of said gain transistor.

7. The combination in accordance with claim 5 further including means for providing constant current into the conductance path of said gain transistor.

8. A comparator circuit for comparing the relative voltage levels of first and second input signals, said comparator circuit comprising:
    first and second input nodes for receiving said first and second input signals;
    a differential input stage comprising differential pair transistors, differential pair current mirror transistors, and a current source transistor for providing constant current into the conductance paths of said differential pair transistors, said differential pair transistors coupled individually at their control electrodes to said first and second input nodes; and
    an hysteresis stage having a conductance path coupled in parallel to the conductance path of one of said current mirror transistors, said hysteresis stage comprising an hysteresis mirror transistor having its conductance path in series with the conductance path of a switching transistor, said hysteresis stage responsive to a conductance state of one of said differential pair transistors for enabling current through said hysteresis stage.

9. The comparator circuit in accordance with claim 8 further including a gain stage coupled to one of said differential pair transistors.

10. The comparator circuit in accordance with claim 9 further including an output stage coupled to said gain stage.

11. The comparator circuit in accordance with claim 10 further including an output node coupled to said output stage for providing an output signal indicative of the relative voltage levels of said first and second input signals.

12. The comparator circuit in accordance with claim 11 wherein said differential pair transistors are substantially identical, and wherein said differential pair current mirror transistors are substantially identical.

13. The comparator circuit in accordance with claim 11 wherein said hysteresis mirror transistor has its control electrode coupled to the control electrodes of said differential pair current mirror transistors.

14. The comparator circuit in accordance with claim 11 wherein said gain stage includes a gain transistor coupled to a conductance electrode of one of said differential pair transistors.

15. The comparator circuit in accordance with claim 14 wherein said switching transistor has its control electrode coupled to a conductance electrode of said gain transistor.

16. The comparator circuit in accordance with claim 14 further including means for providing constant current into the conductance path of said gain transistor.

* * * * *